United States Patent
Gupta et al.

(10) Patent No.: US 7,608,524 B2
(45) Date of Patent: Oct. 27, 2009

(54) METHOD OF AND SYSTEM FOR FORMING SIC CRYSTALS HAVING SPATIALLY UNIFORM DOPING IMPURITIES

(75) Inventors: Avinash K. Gupta, Basking Ridge, NJ (US); Edward Semenas, Allentown, PA (US); Ilya Zwieback, Washington Township, NJ (US); Donovan L. Barrett, Port Orange, FL (US); Andrew E. Souzis, Hawthorne, NJ (US)

(73) Assignee: II-VI Incorporated, Saxonburg, PA (US)

( * ) Notice: Subject to any disclaimer, the term of this patent is extended or adjusted under 35 U.S.C. 154(b) by 329 days.

(21) Appl. No.: 11/405,368

(22) Filed: Apr. 17, 2006

(65) Prior Publication Data

US 2006/0243984 A1   Nov. 2, 2006

Related U.S. Application Data

(60) Provisional application No. 60/672,945, filed on Apr. 19, 2005.

(51) Int. Cl.
    *H01L 21/20* (2006.01)
(52) U.S. Cl. .................. 438/478; 438/542; 257/77; 257/E21.274
(58) Field of Classification Search .................. 117/84, 117/100, 109; 438/478, 542; 257/77, E21.274
    See application file for complete search history.

(56) References Cited

U.S. PATENT DOCUMENTS

| RE34,861 E | 2/1995 | Davis et al. |
| 5,611,955 A | 3/1997 | Barrett et al. |
| 5,667,587 A | 9/1997 | Glass et al. |
| 5,683,507 A | 11/1997 | Barrett et al. |
| 5,746,827 A | 5/1998 | Barrett et al. |
| 5,788,768 A | 8/1998 | Barrett et al. |
| 6,254,674 B1 | 7/2001 | Aydelott |

(Continued)

FOREIGN PATENT DOCUMENTS

GB   1 031 835   6/1966

(Continued)

OTHER PUBLICATIONS

Bickermann et al. "On the preparation of vanadium doped PVT grown SiC boules with high semi-insulating yield", Journal of Crystal Growth 254, (2003), pp. 390-399.*

(Continued)

*Primary Examiner*—Asok K Sarkar
*Assistant Examiner*—Julia Slutsker
(74) *Attorney, Agent, or Firm*—The Webb Law Firm

(57) ABSTRACT

In a physical vapor transport method and system, a growth chamber charged with source material and a seed crystal in spaced relation is provided. At least one capsule having at least one capillary extending between an interior thereof and an exterior thereof, wherein the interior of the capsule is charged with a dopant, is also provided. Each capsule is installed in the growth chamber. Through a growth reaction carried out in the growth chamber following installation of each capsule therein, a crystal is formed on the seed crystal using the source material, wherein the formed crystal is doped with the dopant.

9 Claims, 4 Drawing Sheets

U.S. PATENT DOCUMENTS

| | | |
|---|---|---|
| 6,780,243 B1 | 8/2004 | Wang et al. |
| 6,805,745 B2 | 10/2004 | Snyder et al. |
| 2002/0104478 A1 | 8/2002 | Oguri et al. |

FOREIGN PATENT DOCUMENTS

| | | |
|---|---|---|
| JP | 01108200 | 4/1989 |
| JP | 10007497 | 1/1998 |

OTHER PUBLICATIONS

T. L. Straubinger, M. Bickermann, R. Weingärtner, P. J. Wellmann and A. Winnacker; "Aluminum P-Type Doping of Silicon Caribide Crystals Using A Modified Physical Vapor Transport Growth Method"; Journal of Crystal Growth 240 (2000); (pp. 117-123).

* cited by examiner

METHOD OF AND SYSTEM FOR FORMING SIC CRYSTALS HAVING SPATIALLY UNIFORM DOPING IMPURITIES

This application claims priority from U.S. Provisional Patent Application No. 60/672,945, filed Apr. 19, 2005, which is incorporated herein by reference.

BACKGROUND OF THE INVENTION

Unique electronic properties of silicon carbide (SiC) make it a very desirable material for state-of-the-art semiconductor devices that can operate at high frequencies, high voltages and current densities, and in harsh conditions. In many such devices, silicon carbide is utilized as a substrate on which the semiconductor device structure is formed using epitaxy, photolithography and metallization. Depending on the device design, the substrate must possess specified electronic parameters, such as conductivity type and resistivity. While devices operating at high and microwave frequencies (RF devices) require semi-insulating (SI) substrates with very high resistivity, for other devices, such as high power switching devices, low-resistivity n-type and p-type substrates are needed.

Presently, SiC single crystals are grown on the industrial scale by a sublimation technique called Physical Vapor Transport (PVT). A schematic diagram of a typical prior art PVT arrangement is shown in FIG. 1. In PVT, polycrystalline grains of silicon carbide (SiC source) 1 are loaded on the bottom of a growth container 2 and a SiC seed crystal 4 is attached to a top of growth container 2. Desirably, growth container 2 is made of a material, such as graphite, that is not reactive with SiC or any dopant (discussed hereinafter) added thereto. The loaded growth container 2 is evacuated, filled with inert gas to a certain, desired pressure and heated via at least one heating element 3 (e.g., an RF coil) to a growth temperature, e.g., between 1900° C. and 2400° C. Growth container 2 is heated in such a fashion that a vertical temperature gradient is created making the SiC source 1 temperature higher than that of the SiC seed 4. At high temperatures, silicon carbide of the SiC source 1 sublimes releasing a spectrum of volatile molecular species to the vapor phase. The most abundant of these gaseous species are Si, $Si_2C$ and $SiC_2$. Driven by the temperature gradient, they are transported to the SiC seed 4 and condense on it causing growth of a SiC single crystal 5 on the SiC seed 4. Prior art patents in this area include, for example, U.S. Pat. Nos. 6,805,745; 5,683,507; 5,611,955; 5,667,587; 5,746,827; and Re. 34,861, which are all incorporated herein by reference.

Those skilled in the art of semiconductor materials know that production of SiC substrates with desirable electronic properties is impossible without purposeful introduction of certain impurities in a process known as doping. In silicon carbide, the chemical bonds are so exceptionally strong and solid-state diffusion of impurities is so slow that doping in the bulk can be accomplished only at the stage of crystal growth, when the doping element (dopant) incorporates directly into the lattice of the growing SiC crystal 5.

As a particular example of SiC doping during growth, n-type SiC crystals are produced by adding small amounts of gaseous nitrogen ($N_2$) to growth container 2 atmosphere. Nitrogen-doped SiC single crystals with very uniform electrical properties can be readily grown by maintaining appropriate partial pressure of $N_2$ during growth.

With the exception of the nitrogen-doped crystals, attaining uniform electrical properties in other types of SiC crystals, including semi-insulating, p-type and phosphorus doped n-type crystals, is much more difficult because the doping compounds are not gaseous but solid. Vanadium is one particularly important dopant, which is used to produce a high-resistivity semi-insulating SiC crystal. Aluminum is another important dopant used for the growth of conductive crystals of p-type. Other solid dopants include boron, phosphorus, heavy metals and rare earth elements.

Prior art doping of SiC crystals using a solid dopant is carried out by admixing small amounts of impurity directly to the SiC source 1. For instance, vanadium can be introduced in the form of elemental vanadium, vanadium carbide or vanadium silicide. Aluminum can be introduced in the elemental form, aluminum carbide or aluminum silicide. Other suitable solid dopants, such as boron or phosphorus, can be similarly introduced as elements, carbides or silicides. The doping compound can be in the physical form of powder, pieces or chips.

During SiC crystal 5 sublimation growth, multi-step chemical reactions take place between the SiC source 1 and the dopant admixed directly in the SiC source. These reactions proceed through several stages and lead to the formation of multiple intermediary compounds. In the case of vanadium doping, thermodynamic analysis shows that the product of reaction between SiC and vanadium dopant (whether elemental, carbide or silicide) depends on the stoichiometry of SiC. That is, when the SiC source 1 is Si-rich and its composition corresponds to the two-phase equilibrium between SiC and Si, formation of vanadium silicide ($VSi_2$) is likely. When the SiC source is C-rich and its composition corresponds to the two-phase equilibrium between SiC and C, formation of vanadium carbide ($VC_x$) is likely.

It is known that freshly synthesized SiC source 1 is, typically, Si-rich. Due to the incongruent character of SiC sublimation, the initially silicon-rich SiC source 1 gradually becomes carbon-rich. This change in the stoichiometry of the SiC source 1 during sublimation growth causes the following sequence of reactions:

During initial stages of growth, when the SiC source 1 is Si-rich, reaction between vanadium dopant and SiC yields vanadium silicide $VSi_2$.

As the growth progresses and the SiC source 1 becomes more carbon-rich, vanadium silicide converts to intermediate carbo-silicide $VC_xSi_y$.

During final stages of growth, when the SiC source 1 is carbon-rich, vanadium carbo-silicide converts into vanadium carbide $VC_x$.

Accordingly, the partial pressure of vanadium-bearing species in the vapor phase decreases from high at the beginning of growth to low at the end. The change in the vanadium partial pressure results in the characteristic concentration profile with too much vanadium in the first-to-grow portions of the SiC crystal 5 boule and too little in the last-to-grow portions. For this reason, electrical properties of SiC crystals grown using the doping technique of prior art are spatially nonuniform and the yield of high electronic quality substrates is low.

The above case of vanadium doping was given for the purpose of example only. Similar problems exist in the cases when other solid dopants are added to the SiC source 1 directly, including, but not limited to aluminum, boron and phosphorus.

SUMMARY OF THE INVENTION

The present invention is a method for producing a spatially uniform and controlled concentration of a dopant throughout a SiC crystal boule. The method avoids or eliminates the too high dopant concentration in the first-to-grow boule portions and the too low dopant concentration in the last-to-grow portions. In accordance with the present invention, the dopant concentration can be sufficiently high to achieve the desired electronic properties of the SiC material while, at the same time, the dopant concentration can be low enough to avoid generation of crystal defects. In the doping method in accordance with the present invention, the dopant concentration does not change as the crystal grows. Therefore, longer boules with spatially uniform electrical properties can be grown resulting in higher quality of the SiC substrates, higher yields and productivity.

DETAILED DESCRIPTION OF THE INVENTION

Figure 1:
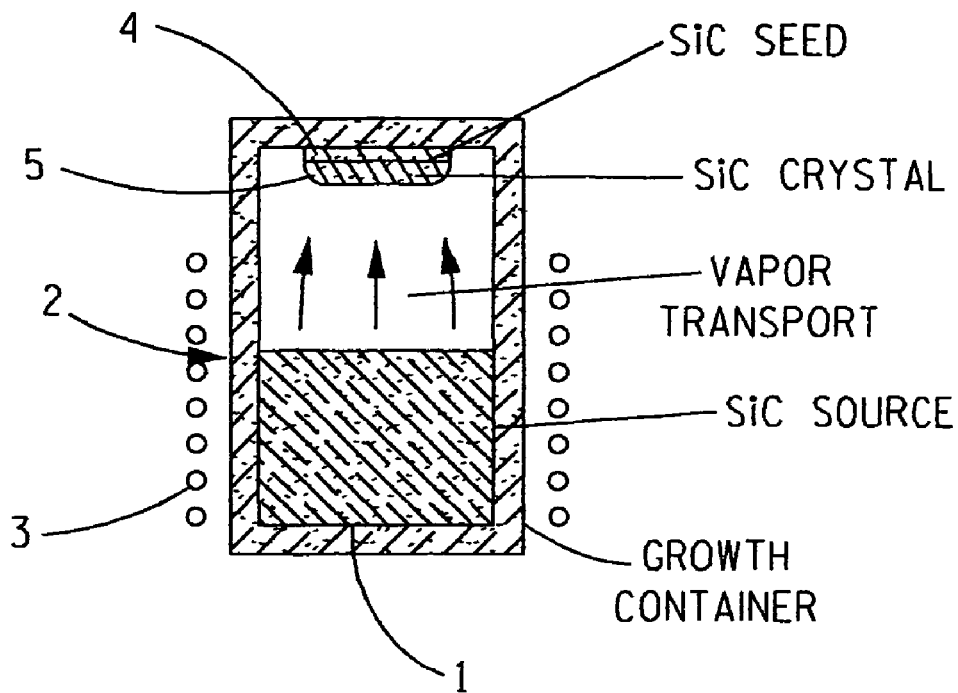
FIG. 1 is a cross section of a prior art physical vapor transport arrangement.
Figure 2:
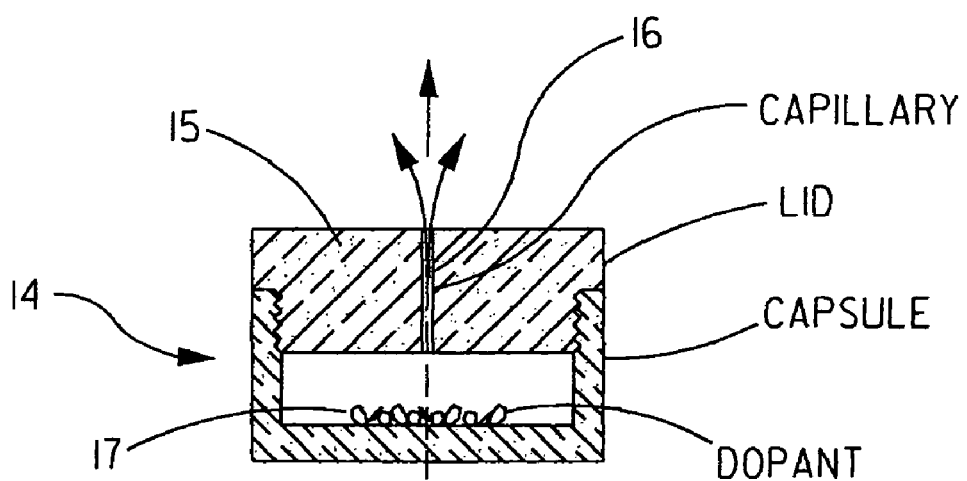
FIG. 2 is a cross section of a time-release capsule in accordance with the present invention for use in the physical vapor transport arrangement shown in FIG. 1.

With reference to FIG. 2, the advantages of spatially uniform and controlled doping are realized using a time-release capsule 14, which is loaded with a stable form of solid dopant, and placed inside growth container 2. Capsule 14 is desirably made of an inert material, which is reactive with neither SiC nor the dopant. For a majority of applications, dense and low-porosity graphite is a preferred material for capsule 14. Other possible materials include refractory metals, their carbides and nitrides. However, this is not to be construed as limiting the invention.

Capsule 14 includes a tight lid 15 having one or more calibrated through-holes or capillaries 16 of predetermined diameter and length. There are no limitations on the dimensions of capsule 14 except that it should fit inside growth container 2 and not restrict the flow of vapor to the SiC seed 4.

At a suitable time, capsule 14 is loaded with the proper amount of solid dopant 17. Dopant 17 must be either in a stable chemical form that is not reactive with the material of capsule 14 or in a form that upon reaction with the material forming capsule 14 produces a stable compound. For the majority of practical applications, the preferred forms of solid dopant are: (i) elemental form, (ii) carbide and (iii) silicide. However, this is not to be construed as limiting the invention.

During sublimation growth of the SiC crystal 5, capsule 14 is situated inside growth container 2. In one embodiment, shown in FIG. 3a, a single capsule 14 is positioned on the top surface of the SiC source 1 near the axis of growth container 2. In another embodiment, shown in FIG. 3b, several capsules 14 are positioned on the top surface of the SiC source 1 near the wall of growth container 2. In yet another embodiment, shown in FIG. 3c, capsule 14 is buried within the material forming the SiC source 1.

The principle of operation of capsule 14 is based on the well-known phenomenon of effusion, i.e., the slow escape of vapor from a sealed vessel through a small orifice. At high temperatures, the vapor pressure of dopant 17 inside capsule 14 forces it to escape through each capillary 16. If the cross section of each capillary 16 is sufficiently small, the vapor pressure of dopant 17 in capsule 14 does not differ substantially from the equilibrium value.

The laws of effusion are well-known and, for given growth conditions (temperature, vapor pressure of the inert gas, volatility of the substance contained in capsule 14, capillary 16 diameter and capillary 16 length), the flux of the molecules of dopant 17 escaping capsule 14 via each capillary 16 can be readily calculated. Thus, the dimension of each capillary 16 and number of capillaries 16 can be tailored to achieve a steady and well-controlled flux of the impurity dopant 17 atoms from capsule 14 to the growing SiC crystal 5.

Figure 3A:
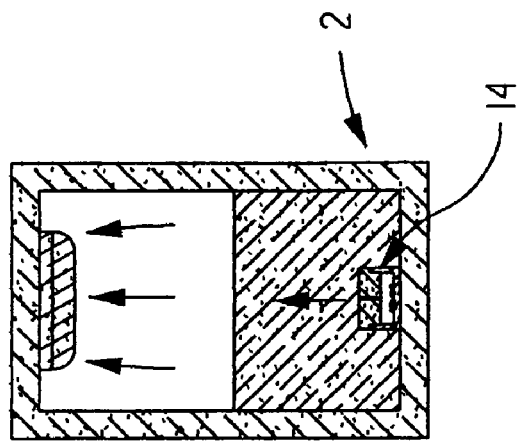
FIGS. 3a-3c are cross-sectional views of one or more capsules of FIG. 2 positioned in different locations within the physical vapor transport arrangement shown in FIG. 1.
Figure 3B:
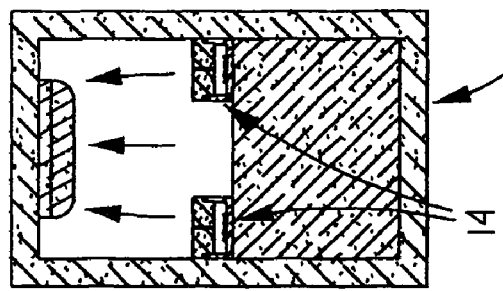
Figure 3C:
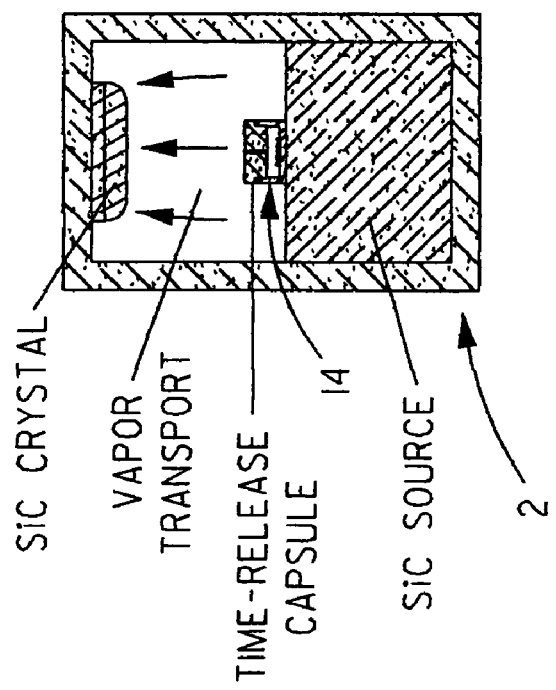

For relatively small doping levels, a capsule 14 having a single capillary 16 can be used (see embodiment in FIG. 3a). For higher doping levels or doping with multiple dopants 17, multiple capsules 14 can be used (see embodiment in FIG. 3b), as well as a capsule 14 with multiple capillaries. For special purposes, such as programmable or delayed doping, one or more time-release capsules 14 buried in the depth of the SiC source 1 can be utilized (see embodiment in FIG. 3c).

According to prior art SiC doping, a small amount of dopant is admixed directly to the SiC source 1 material, leading to chemical reactions between the dopant and SiC source 1. These reactions, combined with changes in the stoichiometry of the SiC source 1 material, lead to progressive changes in the partial pressure of the dopant. As a result, prior art doping produces initially high concentrations of dopant in the crystal followed by a decrease in the dopant concentration over the SiC crystal 5 length. Crystals grown according to the prior art have too high a degree of dopant in the first-to-grow sections and insufficient dopant in the last-to-grow sections. The dopant level in the first-to-grow boule sections can be so high that second-phase precipitates form in the crystal bulk leading to the generation of crystal defects.

The present invention eliminates the problems of the prior art by using one or more time-release capsules 14 for the doping of SiC crystals 5 during crystal growth. The invention has two distinct advantages:

First, the present invention eliminates direct contact between the dopant 17 and the SiC source 1. This is accomplished by placing the dopant 17 inside of a capsule 14 made of an inert material.

Second, the present invention offers a means for precise control of the dopant 17 concentration. This is achieved by choosing the number of capsules 14, the number and dimensions of the capillaries 16, and the position of each capsule 14 within growth container 2.

The present invention offers the following technical advantages over the prior art. First, it eliminates direct contact between the dopant 17 and the SiC source 1, so the transient processes associated with the chemical reactions between the dopant 17 and SiC source 1 are avoided or eliminated. Secondly, the present invention provides a means to precisely control the flux of the dopant 17 to the SiC seed 4. These technical advantages lead to the production of precisely and uniformly doped SiC crystals 5.

The direct consequence of precise and spatially uniform doping is SiC single crystals 5 with spatially uniform and controllable electrical properties. In addition to the superior electrical properties, the invention eliminates the formation of impurity precipitates and associated defects and, thus, leads to the improvement in the SiC crystal 5 quality and wafer yield.

Specifically, for a vanadium doped SiC crystal 5, the application of the present invention increases the yield of usable prime quality SiC wafers by as much as 50%. This in-turn leads to reduced costs and improved profitability.

The present invention has been applied to the growth of semi-insulating 6H—SiC single crystals doped during growth with vanadium. However, this is not to be construed as limiting the invention since it is envisioned that the invention can also be applied to the growth of 4H—SiC, 3C—SiC or 15R—SiC single crystals doped during growth with a suitable dopant. In Examples 2 and 3 below, a single time-release capsule 14 made of pure dense graphite was used. All other parameters of the SiC growth process, such as temperature, pressure, temperature gradient, etc., were in accordance with existing growth techniques used for the production of SiC crystals 5.

EXAMPLE 1

In accordance with the prior art SiC crystal growth method, an appropriate amount of elemental vanadium was admixed to the SiC source 1. The SiC source/vanadium mixture and a SiC seed 4 were loaded into growth container 2 which was then evacuated and filled with an inert gas to a desired pressure. Following this, the temperature of growth container 2 was raised to a temperature sufficient to cause the growth of the SiC crystal 5.

Thereafter, the grown SiC crystal 5 boule was sliced into wafers and the impurity content for vanadium and other elements was measured using Secondary Ion Mass Spectroscopy (SIMS) in wafer #2 and wafer #17 (the last wafer in the boule). The results showed that wafer #2 contained vanadium at about $1.4 \times 10^{17}$ cm$^{-3}$ while wafer #17 contained vanadium at about $2 \times 10^{14}$ cm$^{-3}$.

Figure 4:
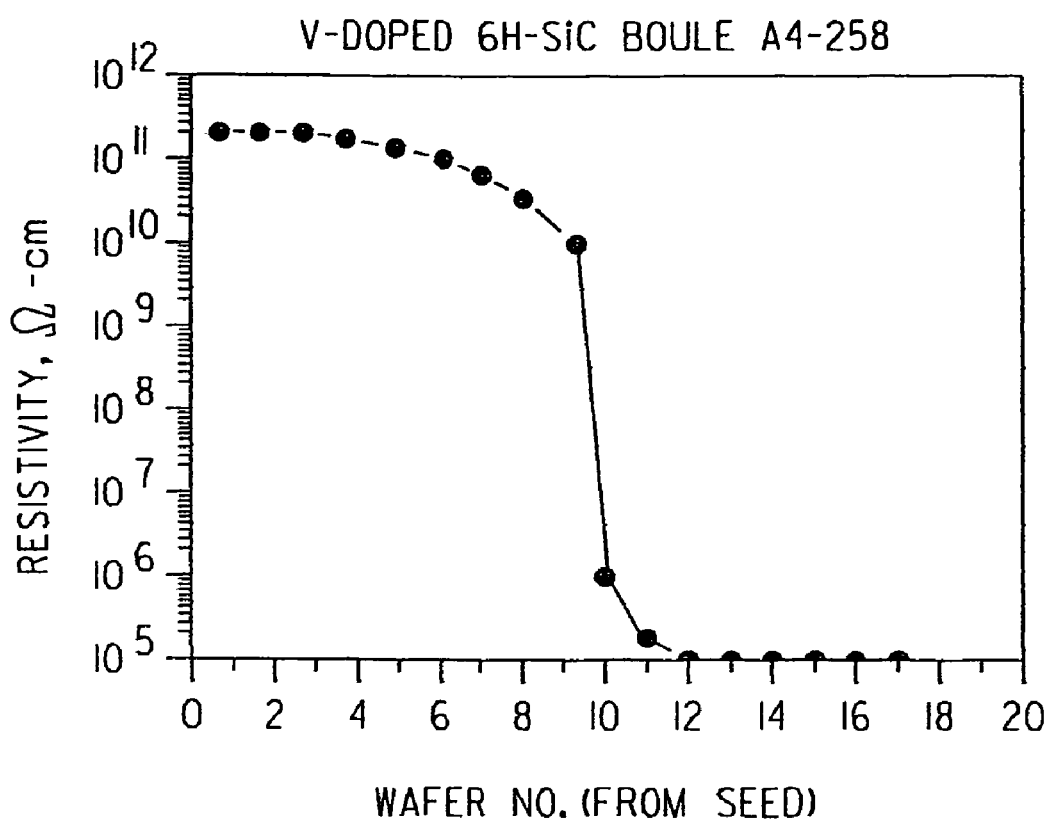
FIG. 4 is a graph of resistivity versus wafer number for wafers sliced from a boule grown in accordance with the prior art.

With reference to FIG. 4, the resistivity of each wafer obtained from the grown boule was measured and plotted. In the plot, each point represents an average resistivity for the particular wafer. As can be seen, the resistivity of the first-to-grow wafers is very high (on the order of $2 \times 10^{11}$ Ωcm) while the resistivity of the last-to-grow wafers is low, below $10^5$ Ωcm. One skilled in the art would immediately recognize that only those wafers that have the resistivity above $10^5$ Ωcm are semi-insulating and can be used in the manufacturing of RF devices, while wafers with the resistivity below $10^5$ Ωcm would be rejected.

Figure 5:
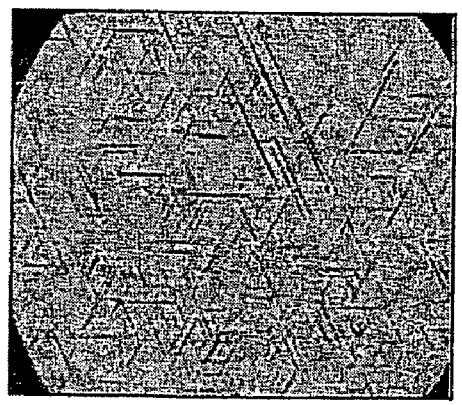
FIG. 5 is a low magnification optical view of the first wafer utilized to form the plot shown in FIG. 4.

Investigation under a low-magnification optical microscope of the first-to-grow wafers sliced from this boule showed that at least three of them contained precipitates of V-rich second phase (see FIG. 5). The precipitates caused generation of defects such as dislocations and micropipes, which spread from the area populated by precipitates into other parts of the boule.

Thus, prior art SiC doping causes nonuniform distribution of dopant, spatially nonuniform electrical properties, and formation of crystal defects.

EXAMPLE 2

In accordance with a SiC crystal growth method of the present invention, a capsule 14 having a capillary 16 of 1.5 mm in diameter and 6 mm long was loaded with 1 g of pure vanadium carbide (VC$_{0.88}$, 99.999+%). Capsule 14 was positioned atop the SiC source 1 in growth container 2. All other parameters of this growth run were in accordance with existing standard technological procedures.

After finishing this growth run and cooling to room temperature, capsule 14 was recovered and its content investigated. A pellet of sintered vanadium carbide was found inside capsule 14. Chemical analysis of the pellet showed that it consisted of vanadium and carbon in the stoichiometric ratio of VC$_x$ (x≈0.8) with traces of silicon accounting for less than 3 weight %. Thus, there was no major chemical transformation in capsule 14 during growth, and vanadium was preserved in its stable form of vanadium carbide. The traces of silicon could be a result of silicon diffusion through the capsule wall or silicon vapor back streaming through the capillary 16. Both these marginal processes could not change significantly the composition of the dopant 17 in capsule 14.

The grown boule was sliced into wafers, two of which, wafer #03 (near the SiC seed 4) and wafer #15 (near the boule dome), were analyzed for impurity content using SIMS. The results showed that wafer #03 contained vanadium at a level of $2.90 \times 10^{16}$ cm$^{-3}$ while wafer #15 contained vanadium at a level of $2.34 \times 10^{16}$ cm$^{-3}$. Investigation under a microscope found no precipitates of secondary phases. Moreover, the density of micropipes and other defects in this boule was observed to be low.

Figure 6:
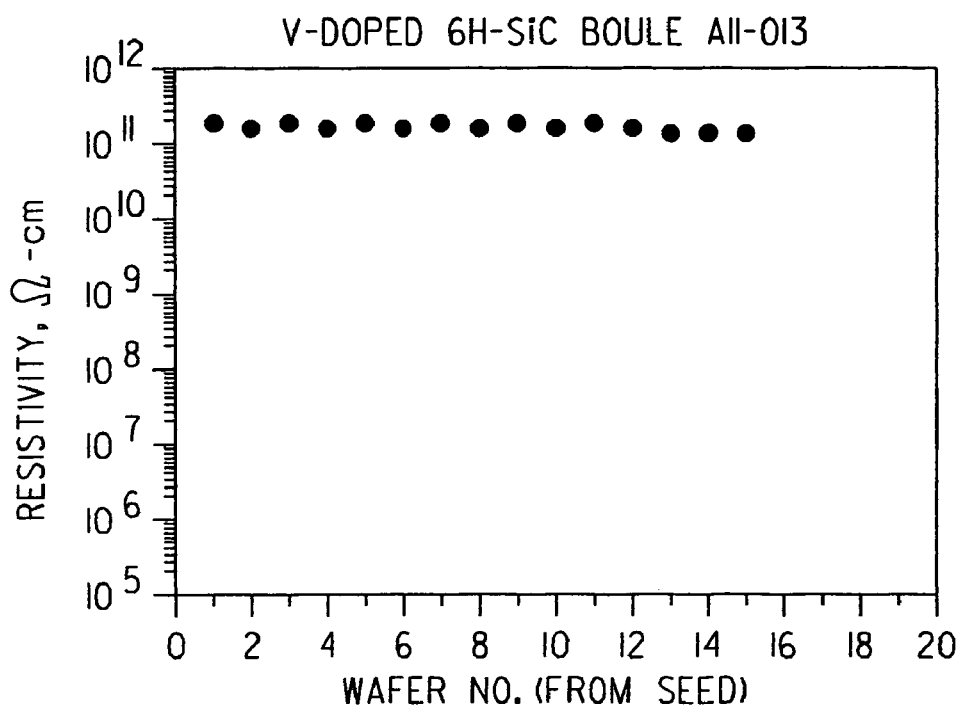
FIG. 6 is a plot of the resistivity of each wafer sliced from a boule grown in accordance with the present invention.

With reference to FIG. 6, the resistivity of each wafer obtained from the boule grown in accordance with this Example 2 was measured and plotted. In the plot, each point represents an average resistivity for the particular wafer. As can be seen, the resistivity of all 15 wafers sliced from this boule was close to $1.7 \times 10^{11}$ Ωcm, with no visible decrease in the last-to-grow wafers.

EXAMPLE 3

In accordance with a SiC crystal growth method of the present invention, a capsule 14 having a capillary 16 of 1.5 mm in diameter and 6 mm long was loaded with 1 g of elemental vanadium of 99.995% purity. Capsule 14 was positioned atop the SiC source 1 in growth container 2. All other parameters of this growth run were in accordance with existing standard technological procedures.

After finishing this growth run and cooling to room temperature, the capsule content was investigated. It was found that during heating to the growth temperature, vanadium melted and reacted with carbon of the capsule wall to form stable vanadium carbide, VC$_x$ with x≈0.9. No further chemical transformations occurred during growth cycle.

The grown boule was sliced into wafers, two of which, wafer #03 and wafer #17 (the last wafer of the boule), were analyzed for impurity content using SIMS. The results showed that wafer #03 contained vanadium at a level of $3.4 \times 10^{16}$ cm$^{-3}$ while wafer #17 contained vanadium at a level of about $2.7 \times 10^{16}$ cm$^{-3}$.

Figure 7:
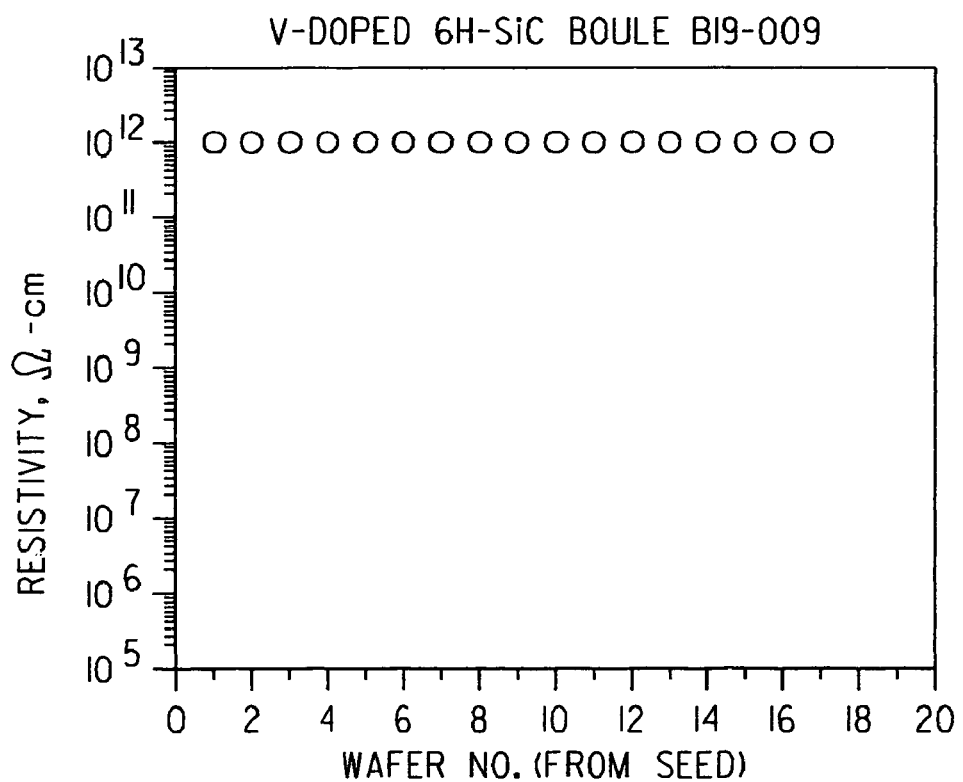
FIG. 7 is another plot of the resistivity of each wafer sliced from another boule grown in accordance with the present invention.

The resistivity in the wafers sliced from this boule was so high that it exceeded the upper sensitivity limit of the measuring instrument. Accordingly, the resistivity data is plotted in FIG. 7 as empty circles at $10^{12}$ Ωcm indicating that the actual resistivity is higher. These values of resistivity exceeded by several orders of magnitude the current requirements for semi-insulating SiC substrates.

The level of vanadium in this boule was high enough to cause full electrical compensation, but much lower than the solubility limit, so no precipitates of secondary phases were formed. The grown boule was of good crystal quality with low densities of micropipes and other defects.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A physical vapor transport method comprising:
   (a) providing a growth chamber charged with source material and a seed crystal in spaced relation;
   (b) providing at least one capsule having an interior that is charged with dopant, wherein each capsule is comprised of a porous material having pores therein and each capsule includes, in addition to the pores of the porous material, at least one calibrated capillary of predetermined dimensions extending between the interior of the capsule and an exterior of the capsule;
   (c) installing each capsule in the growth chamber; and
   (d) through a growth reaction carried out in the growth chamber following step (c), forming a crystal on the seed crystal using the source material, wherein the formed crystal is doped with the dopant via controlled effusion of the dopant through the at least one capillary in each capsule.

2. The method of claim 1, wherein at least one of the growth chamber and the capsule is made of a material that is not reactive with the source material or the dopant.

3. The method of claim 2, wherein the material forming the growth chamber and/or the capsule is graphite.

4. The method of claim 1, wherein the dopant:
   is in one of the following chemical forms: elemental; carbide and silicide; and/or has at least one of the following physical forms: powder, pieces and/or chips.

5. The method of claim 1, wherein:
   the dopant includes at least one of the following: vanadium, aluminum, boron and phosphorus.

6. The method of claim 1, wherein, prior to step (d), the source material is initially in powder form.

7. The method of claim 1, wherein the source material includes SiC.

8. The method of claim 1, wherein step (d) includes:
   evacuating the growth chamber; and
   heating the growth chamber to a desired reaction temperature such that a temperature gradient is created between the source material and the seed crystal whereupon the seed crystal is at a lower temperature than the source material.

9. The method of claim 1, wherein, prior to heating the growth chamber, step (d) includes filling the growth chamber with inert gas to a desired pressure.

* * * * *

UNITED STATES PATENT AND TRADEMARK OFFICE
CERTIFICATE OF CORRECTION

PATENT NO.      : 7,608,524 B2
APPLICATION NO. : 11/405368
DATED           : October 27, 2009
INVENTOR(S)     : Gupta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 345 days.

Signed and Sealed this

Twelfth Day of October, 2010

David J. Kappos
*Director of the United States Patent and Trademark Office*